(12) United States Patent
Worledge

(10) Patent No.: US 8,482,968 B2
(45) Date of Patent: Jul. 9, 2013

(54) NON-VOLATILE MAGNETIC TUNNEL JUNCTION TRANSISTOR

(75) Inventor: Daniel C. Worledge, Poughquag, NY (US)

(73) Assignee: International Business Machines Corporation, Armonk, NY (US)

(*) Notice: Subject to any disclaimer, the term of this patent is extended or adjusted under 35 U.S.C. 154(b) by 318 days.

(21) Appl. No.: 12/945,848

(22) Filed: Nov. 13, 2010

(65) Prior Publication Data

US 2012/0120719 A1    May 17, 2012

(51) Int. Cl.
G11C 11/00    (2006.01)
G11C 11/14    (2006.01)
G11C 11/15    (2006.01)

(52) U.S. Cl.
USPC .................... 365/158; 365/171; 365/173

(58) Field of Classification Search
USPC ........................... 365/158, 171, 173
See application file for complete search history.

(56) References Cited

U.S. PATENT DOCUMENTS

| | | | | |
|---|---|---|---|---|
| 7,054,186 B2* | 5/2006 | Iwata | ............. | 365/158 |
| 7,206,220 B2* | 4/2007 | Ditewig et al. | ............. | 365/158 |
| 7,332,781 B2* | 2/2008 | Nozieres et al. | ............. | 365/173 |
| 7,821,818 B2* | 10/2010 | Dieny et al. | ............. | 365/158 |
| 7,952,906 B2* | 5/2011 | Lim | ............. | 365/158 |
| 8,274,811 B2* | 9/2012 | Zhang et al. | ............. | 365/158 |
| 2006/0039188 A1 | 2/2006 | Ju | ............. | 365/158 |
| 2006/0039194 A1 | 2/2006 | Hidaka | ............. | 365/171 |
| 2007/0159735 A1 | 7/2007 | Butcher et al. | ............. | 360/324.2 |

OTHER PUBLICATIONS

Y. Shiota, et. al, "Voltage-Assisted Magnetization Switching in Ultrathin $Fe^{80}Co^{20}$ Alloy Layers", Applied Physics Express 2, The Japan Society of Applied Physics 063001, pp. 1-3 (2009).
Evgeny Y Tsymbal et al., "Spin-dependent tunneling in magnetic tunnel junctions" J. Phys.: Condens. Matter 15, R109-R142 (2003).
J. K. Han et al., "Thermal stability of a nanostructured trilayer synthetic antiferromagnet" J. Appl. Phys. 101, 09F506, pp. 1-3 (2007).
D. C. Worledge, "Theory for toggle magnetic random access memory: The asymmetric case" Appl. Phys. Lett. 91, 162509, pp. 1-3 (2007).
L. Jiang et al., "Large Tunnel Magnetoresistance of 1056% at Room Temperature in MgO Based Double Barrier Magnetic Tunnel Junction" Appl. Phys. Express 2 083002 (2009).

* cited by examiner

*Primary Examiner* — Trong Phan
(74) *Attorney, Agent, or Firm* — Ido Tuchman; Vazken Alexanian

(57) ABSTRACT

An example embodiment is an apparatus for controlling a magnetic direction of a magnetic free layer. The apparatus includes a writer with a first magnetic write layer and a second magnetic write layer. Applying a write voltage across first and second magnetic write layers causes a magnetic anisotropy of one of the magnetic write layers to switch from parallel to the plane of the magnetic write layers to orthogonal to the plane of the magnetic write layers. The magnetic write layer with the magnetic anisotropy parallel to the plane of the magnetic write layers induces the magnetic direction in the magnetic free layer.

20 Claims, 7 Drawing Sheets

US 8,482,968 B2

NON-VOLATILE MAGNETIC TUNNEL JUNCTION TRANSISTOR

BACKGROUND

The present invention relates to transistors, and more specifically to voltage control of magnetism for non-volatile magnetic tunnel junction.

The continuous performance improvement derived from CMOS scaling over the past 40 years has come to an end. While density scaling is expected to continue for at least the next ten years, transistor and circuit-level performance is now severely limited by power constraints. The semiconductor industry has been aware of this issue for the last ten years and has tried a wide variety of modifications of the CMOS transistor in order to lower the voltage.

Traditionally, CMOS power has been contained by reducing the operating voltage in each generation. Supply voltages have thus scaled significantly from the 5V technologies used in the 1970's to approximately 1V technologies manufactured today. Further voltage reduction beyond 1V, however, is restricted by fundamental limits in threshold voltage and gate oxide thickness scaling.

Without sufficient voltage scaling, CMOS power has thus increased to the point where laptops are lap-warmers, high performance computing is limited by the cooling power available, and mobile computing performance is limited by battery life. It is fair to say that a low voltage transistor would fundamentally change the world.

SUMMARY

One exemplary aspect of the invention is an apparatus for creating a magnetic field. The apparatus includes a writer with a first magnetic write layer and a second magnetic write layer. When the writer is energized by a first write voltage, the writer is configured to switch a magnetic anisotropy of the first magnetic write layer from parallel to the plane of the first magnetic write layer to orthogonal to the plane of the first magnetic write layer. This causes the second magnetic write layer to induce a first magnetic field in a region proximate the writer. When the writer is energized by a second write voltage opposite to the first write voltage, the writer is configured to switch a magnetic anisotropy of the second magnetic write layer from parallel to the plane of the second magnetic write layer to orthogonal to the plane of the second magnetic write layer. This causes the first magnetic write layer to induce a second magnetic field in the region proximate the writer. The second magnetic field is in a direction opposite the first magnetic field.

Another exemplary aspect of the invention is a method for creating a magnetic field. The method includes applying a write voltage across first and second magnetic write layers. This causes a magnetic anisotropy of the first or second magnetic write layers to switch from parallel to the plane of the magnetic write layers to orthogonal to the plane of the magnetic write layers. The magnetic write layer with the magnetic anisotropy parallel to the plane of the magnetic write layers induces the magnetic field.

Yet another exemplary aspect of the invention is a non-volatile memory cell in an array of memory cells. The memory cell includes a magnetic tunnel junction (MTJ). The MTJ includes a magnetic free layer. The resistance of the MTJ is dependent on the magnetic direction of the magnetic free layer. The memory cell further includes a writer disposed proximate the MTJ. The writer is configured to switch a magnetic anisotropy of either a first or second magnetic write layer from parallel to orthogonal to the plane of the magnetic write layers such that the magnetic write layer with the magnetic anisotropy parallel to the plane of the magnetic write layers induces the magnetic direction in the magnetic free layer of the MTJ.

DETAILED DESCRIPTION

Figure 1:
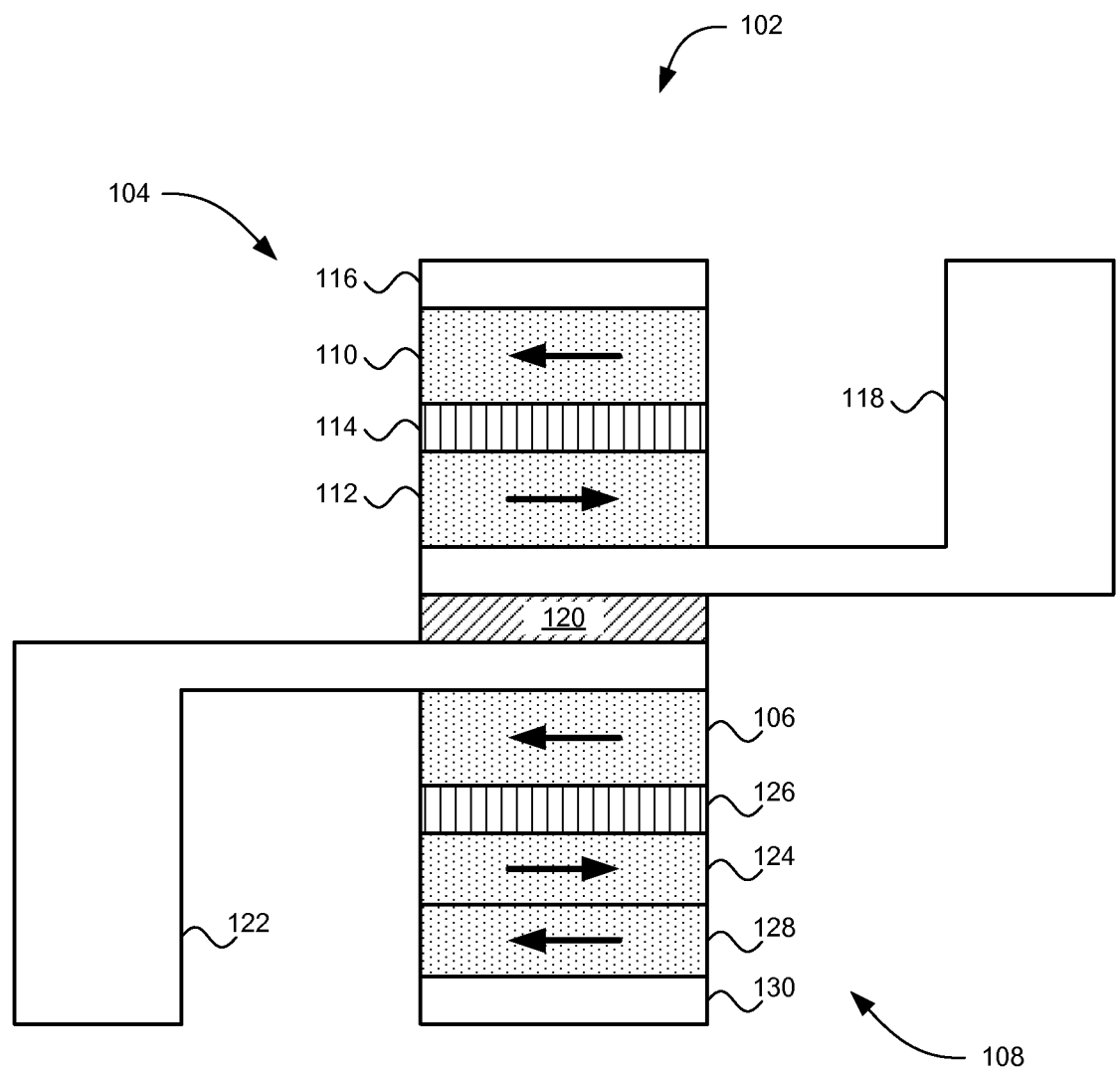
FIG. 1 shows an example embodiment of an apparatus contemplated by the present invention for controlling a magnetic direction of a magnetic free layer.

The present invention is described with reference to embodiments of the invention. Throughout the description of the invention reference is made to FIGS. 1-6B. When referring to the figures, like structures and elements shown throughout are indicated with like reference numerals.

Described here is a new logic device which takes advantage of voltage control of magnetism. The term "voltage control of magnetism" is used when voltage is placed across an insulating system, with negligible steady state current flow. The power dissipation in this case is limited to the transient currents that flow to charge up the wires and devices to the applied voltage.

As detailed below, a non-volatile magnetic tunnel junction contemplated by the present invention is a four terminal transistor that operates at, for example, 100 mV. Complementary devices are made from the same type of device, simply by wiring the terminals differently. The device retains its logic state when the power is removed. Since the device switches using approximately 10 times lower voltage than CMOS, it dissipates approximately 100 times less active power than CMOS. Since the physical mechanism controlling the switching (magnetic anisotropy) has an abrupt change as a function of voltage, multiple devices can be cascaded in series without losing much gain, despite only having a factor of ten change in resistance from the on to off states. Furthermore, the devices are 3-D stackable.

Figure 2:
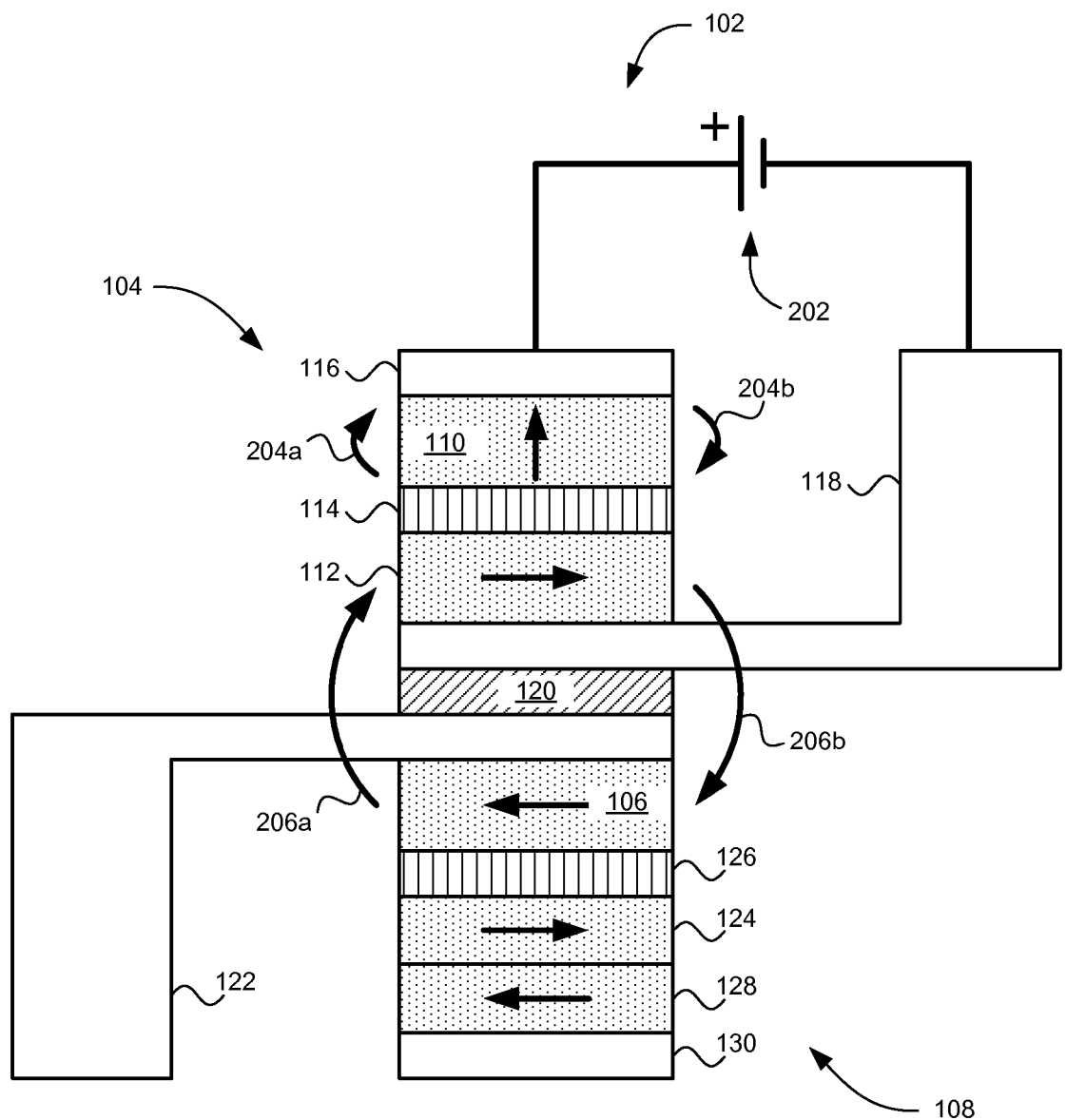
FIG. 2 shows the example apparatus with a positive voltage potential applied across the first and second write electrodes.
Figure 3:
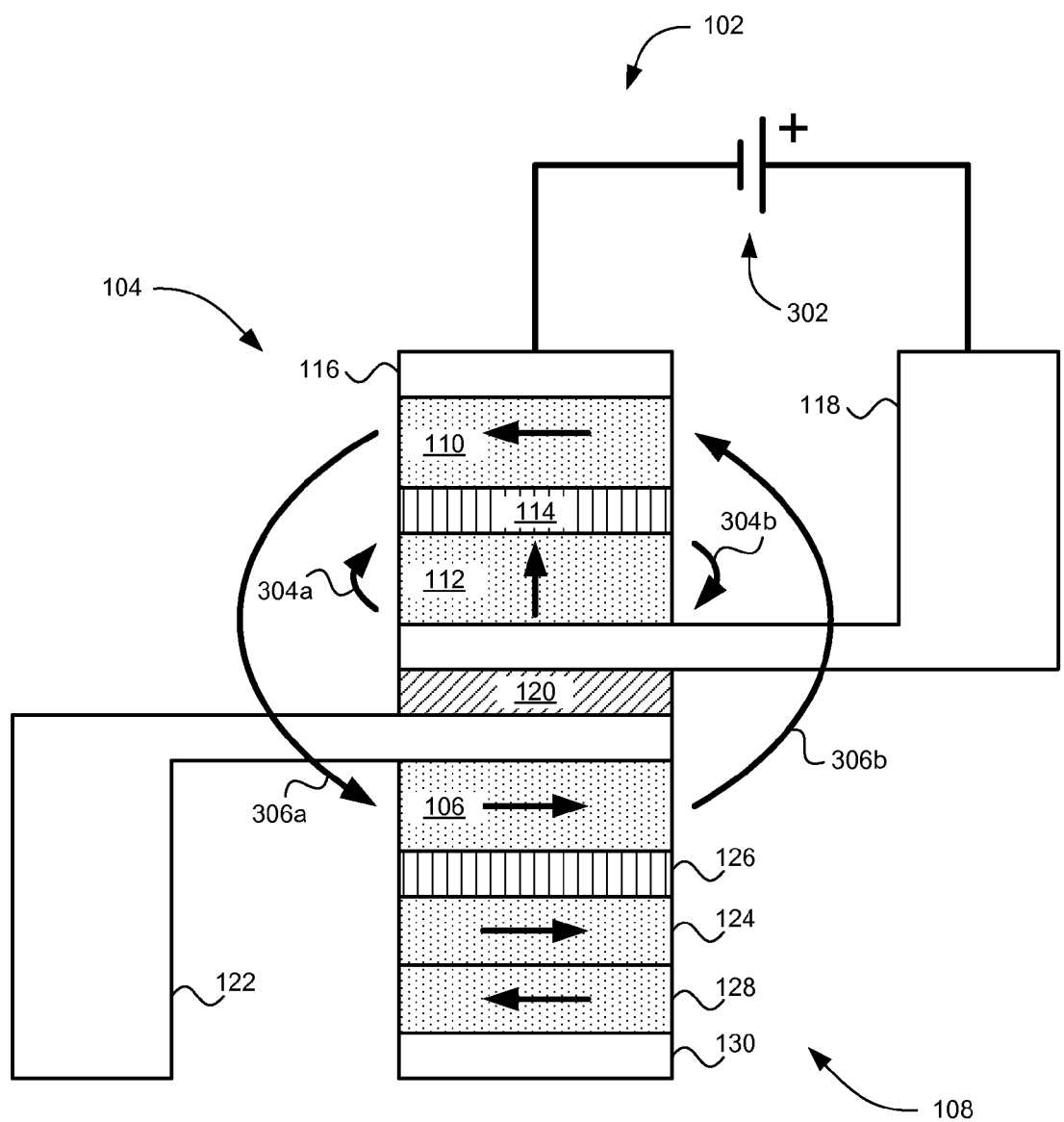
FIG. 3 shows the example apparatus with the polarity of the applied voltage across the first and second write electrodes reversed.

FIGS. 1-3 show an example embodiment of an apparatus 102 contemplated by the present invention for controlling a magnetic direction of a magnetic free layer. As described in detail below, the apparatus 102 includes a writer 104 controlling the magnetic direction of a magnetic free layer 106. In a particular embodiment, the magnetic free layer 106 is part of a magnetic tunnel junction (MTJ) 108 disposed proximate the writer 104, as discussed below.

The writer 104 includes a first write layer 110 and a second write layer 112 separated by a dielectric write layer 114. The first and second magnetic write layers 110 and 120 may be composed of substantially iron (Fe). The dielectric write layer may be composed of substantially magnesium oxide (MgO).

The writer 104 further includes a first write electrode 116 and a second electrode 118. The first write electrode 116 is electrically coupled to the first magnetic write layer, and the second write electrode 118 is electrically coupled to the second magnetic write layer 120.

When the writer 104 is not energized, the magnetic direction of the first magnetic write layer 110 and the second magnetic write layer 112 is parallel to the plane of the magnetic write layers. In other words, the first and second magnetic write layers 110 and 112 are fabricated such that when no voltage is applied across the first and second write electrodes 116 and 118, their magnetic direction is parallel to their length.

Moreover, the magnetic directions of the first and second magnetic write layers 110 and 120 are in opposite to each other when the writer 104 is not energized. This is illustrated in FIG. 1A by the parallel and opposite pointing arrows shown in the first and second magnetic write layers 110 and 112. Because the magnetic direction of first and second magnetic write layers 110 and 120 lie in the plane and are antiparallel, there is no net magnetic field induced on the magnetic free layer 106.

We now turn to FIG. 2, where positive voltage potential 202 is applied across the first and second write electrodes 116 and 118. The voltage potential 202 applied across the bilayer causes a significant change in the magnetic anisotropy of the magnetic write layers. More detail about this phenomenon can be found in Y. Shiota, et. al., "Voltage-Assisted Magnetization Switching in Ultrathin $Fe_{80}Co_{20}$ Alloy Layers", Applied Physics Express 2 (2009) 063001, the content of which is incorporated herein by reference in its entirety.

Specifically, the applied voltage 202 causes the first write magnetic layer 110 to switch its magnetic anisotropy from parallel to the plane of the first magnetic write layer to orthogonal to the plane of the first magnetic write layer. This is illustrated in FIG. 2 by an arrow pointing up in the first write magnetic layer 110. In addition, the applied voltage 202 causes the magnetic anisotropy of second write magnetic layer 112 to be held even more strongly parallel to the plane of the second magnetic write layer.

As a result of the first write magnetic layer 110 switching its magnetic anisotropy to orthogonal to the plane of the first magnetic write layer, its fringing magnetic field becomes localized to the writer 104. This is shown schematically in FIG. 2 by magnetic field lines 204a and 204b. In addition, the fringing magnetic field 206a and 206b of the second magnetic write layer is no longer negated by the first magnetic write layer. Thus, the second magnetic write layer induces a magnetic direction in the magnetic free layer 106.

In FIG. 3, the polarity of the applied voltage 302 across the first and second write electrodes 116 and 118 is reversed. As a result, the fringing magnetic field 304a and 304b of the second magnetic write layer 112 becomes localized to the writer 104. Furthermore, the fringing magnetic field 306a and 306b of the first magnetic write layer 110 induces a magnetic direction in the magnetic free layer 106 in a direction opposite from the direction induced by the second magnetic write layer 106 discussed with respect to FIG. 2.

As mentioned above, the apparatus 102 may include a magnetic tunnel junction (MTJ) 108 positioned proximate the writer 104. As discussed below, the resistance of the magnetic tunnel junction 108 is dependent on the magnetic direction of the magnetic free layer 106. For a detailed discussion of magnetic tunnel junctions, the reader is referred to Evgeny Y Tsymbal, OlegN Mryasov and Patrick R LeClair, "Spin-dependent tunnelling in magnetic tunnel junctions" J. Phys.: Condens. Matter 15, R109-R142 (2003), incorporated herein by reference in its entirety.

Returning to FIG. 1, a dielectric isolation layer 120 is disposed between the second write electrode 118 and a first MTJ electrode 122. The dielectric isolation layer 120 electrically isolates the writer 104 from the magnetic tunnel junction 108. The dielectric isolation layer 120 may be fabricated from various known dielectric materials, such as SiO2, SiN, Al2O3, MgO.

The magnetic tunnel junction 108 includes a magnetic reference layer 124 and a dielectric tunnel barrier 126 disposed between the magnetic reference layer 124 and the magnetic free layer 106. The magnetic reference layer 124 has a magnetic direction pinned to a preset magnetic direction along the plane of the magnetic reference layer 124. The dielectric tunnel barrier 126 is configured to allow electrons to tunnel between the magnetic reference layer 124 and the magnetic free layer 106. A bottom magnetic layer 128 pinned to a magnetic direction opposite of the magnetic direction of the magnetic reference layer 124 may also be used.

The magnetic tunnel junction 108 further includes the first MTJ electrode 122 and a second MTJ electrode 130. The first MTJ electrode 122 is disposed between the dielectric isolation layer 120 and the magnetic free layer 106, and is electrically coupled to the magnetic free layer 106. The second MTJ electrode is electrically coupled to the magnetic reference layer 124 (via the bottom magnetic layer 128).

Figure 4:
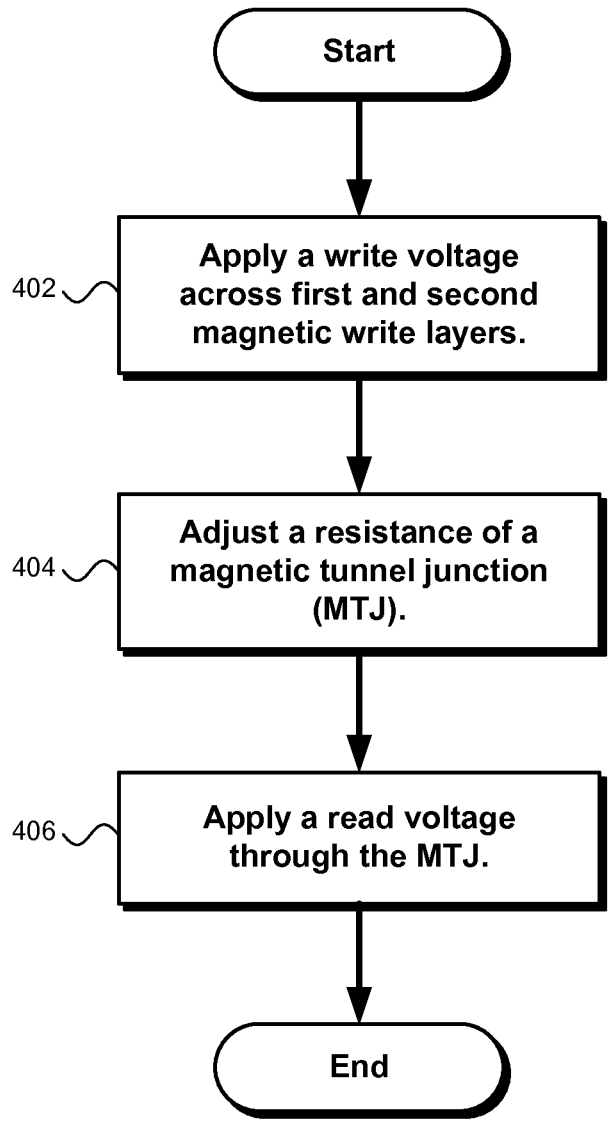
FIG. 4 is a flowchart illustrating an example process to control a magnetic direction of a magnetic free layer in accordance with an embodiment of the present invention.

FIG. 4 is a flowchart for a process to control a magnetic direction of a magnetic free layer in accordance with an embodiment of the present invention. The process starts at applying operation 402. During this step, a write voltage is applied across first and second magnetic write layers such that a magnetic anisotropy of one of the magnetic write layers switches from parallel to the plane of the magnetic write layers to orthogonal to the plane of the magnetic write layers. This, in turn, causes the magnetic write layer with the magnetic anisotropy parallel to the plane of the magnetic write layers to induce a magnetic direction in the magnetic free layer.

As discussed above, a first write electrode may be electrically coupled to the first magnetic write layer, and a second write electrode may be electrically coupled to the second magnetic write layer. The applying operation 402 may include applying a first voltage potential to a first write electrode and applying a second voltage potential to a second write electrode.

As discussed above, the magnetic direction of the first magnetic write layer when parallel to the plane of the magnetic write layers is opposite to the magnetic direction of the second magnetic write layer when parallel to the plane of the magnetic write layers. Thus, a first write voltage applied across the first and second write electrodes causes the magnetic anisotropy of the first magnetic write layer to be orthogonal to the plane of the magnetic first write layer, while a second write voltage applied across the first and second write electrodes opposite in polarity to the first write voltage causes the magnetic anisotropy of the second magnetic write layer to be orthogonal to the plane of the second magnetic write layer.

The process may include an adjusting operation 404 to adjust a resistance of a magnetic tunnel junction (MTJ) disposed proximate the first or second magnetic write layers. The MTJ can include a magnetic reference layer with a magnetic direction pinned to preset direction, and a dielectric tunnel barrier configured to allow electrons to tunnel between the magnetic reference layer and the magnetic free layer. The resistance of the MTJ is dependent on the magnetic direction of the magnetic free layer.

The process may further include an applying operation 406. During applying operation 406, a read voltage is applied across the magnetic free layer and the magnetic reference layer. The voltage drop across the MTJ is determined by the magnetic direction of the magnetic free layer. Thus, the MTJ may be programmed to two or more binary states by applying the write voltage across the first and second magnetic write layer.

Figure 5:
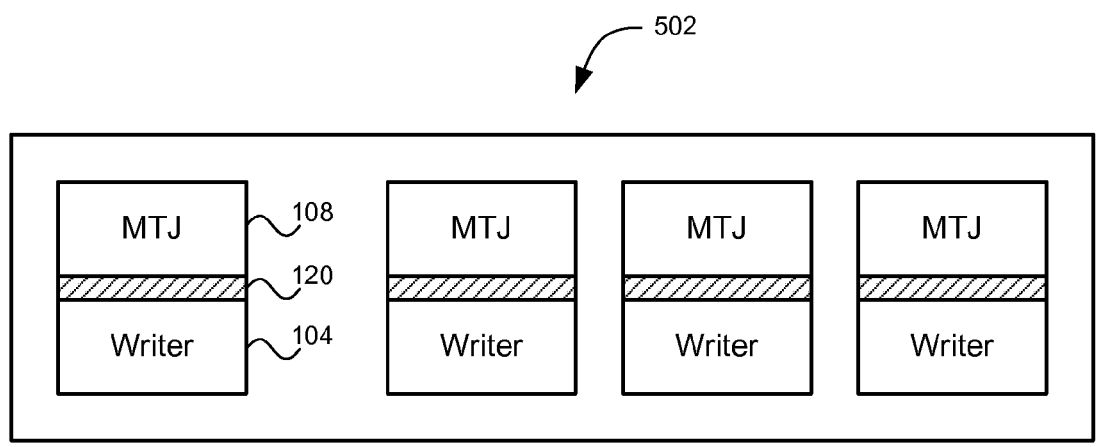
FIG. 5 shows an example array of memory cells in accordance with an embodiment of the present invention.

FIG. 5 illustrates an array of memory cells 502 in accordance with an embodiment of the present invention. Each memory cell in the array includes a MTJ 108 and a writer 102 separated by a dielectric isolation layer 120. The dielectric isolation layer 120 electrically isolates the writer 104 from the MTJ 108.

As discussed above, the MTJ 108 includes a magnetic free layer. The resistance of the MTJ 108 is dependent on the magnetic direction of the magnetic free layer. The writer 104, disposed proximate the MTJ 108, induces a magnetic direction in the magnetic free layer.

The writer includes first and second magnetic write layers. Applying a voltage to the writer causes the magnetic anisotropy of either the first and second magnetic write layers to switch from parallel to the plane of the magnetic write layers to orthogonal to the plane of the magnetic write layers. As discussed above, the magnetic write layer with the magnetic anisotropy parallel to the plane of the magnetic write layers induces the magnetic direction in the magnetic free layer of the MTJ 108.

Figure 6A:
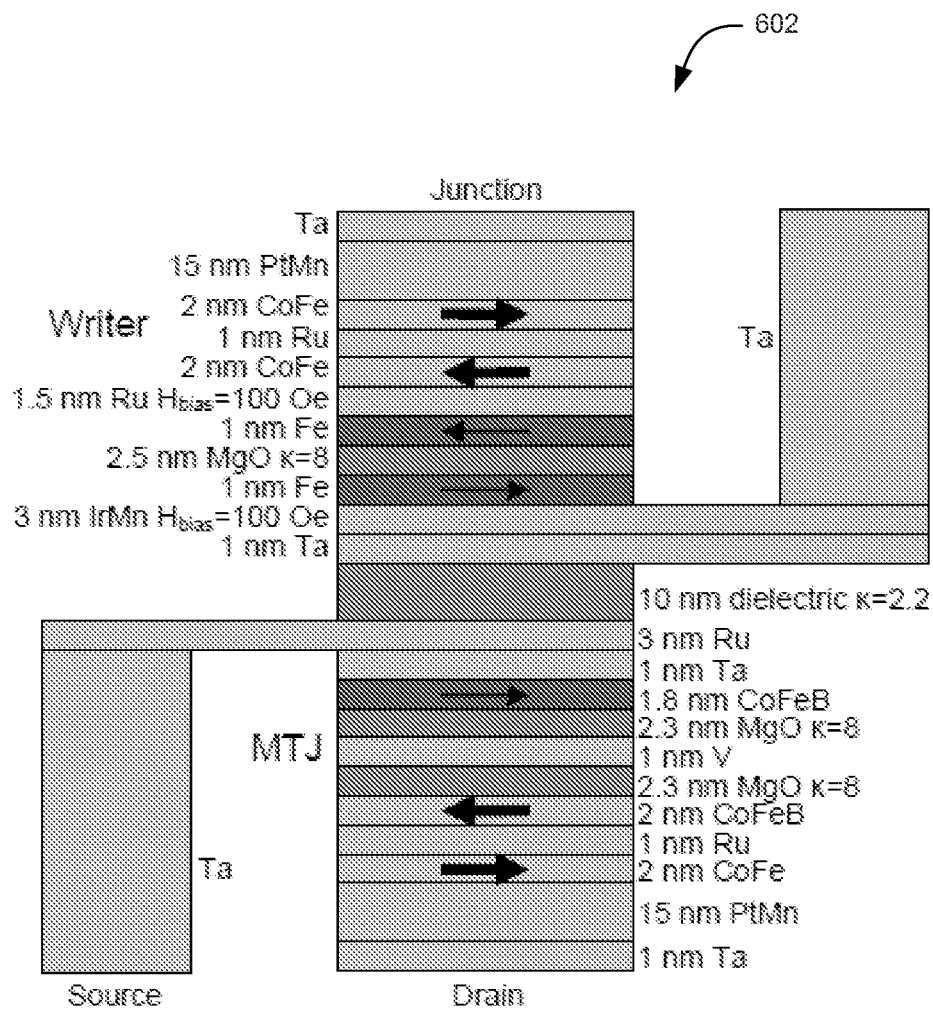
FIGS. 6A and 6B show another embodiment of an example magnetic tunnel junction transistor (MTJT) contemplated by the present invention.
Figure 6B:
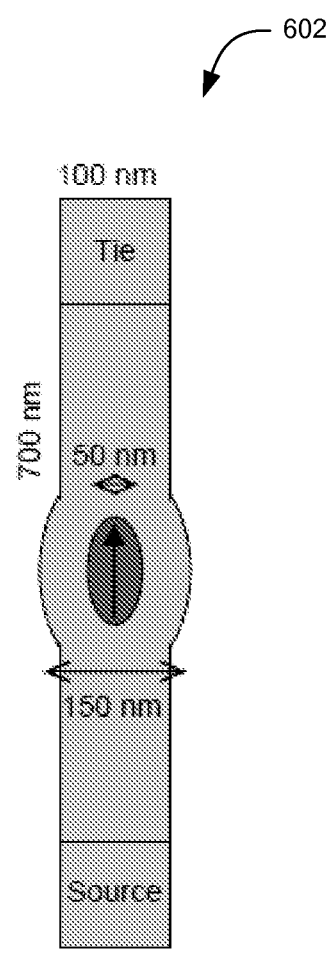

FIGS. 6A and 6B show an example magnetic tunnel junction transistor (MTJT) 602 contemplated by the present invention. The MTJT 602 has two distinct parts: a writer and a magnetic tunnel junction (MTJ) separated by a 10 nm dielectric layer. FIG. 6A shows a cross-section view of the MTJT. FIG. 6B shows a plan view of the MTJT 602.

The core of the writer is an MgO layer sandwiched in-between two Fe layers. The writer design takes advantage of the voltage control of anisotropy effect in both Fe layers in the writer. For a given sign of applied voltage across the MgO, one Fe layer is held in-plane even more strongly, and the other Fe layer is made perpendicular. As discussed above, the result is that the fringing field from the in-plane Fe layer then writes the free layer in the MTJ.

When the opposite sign of voltage is applied, the free layer is written in the opposite direction. When no voltage is applied, both Fe layers lie in the plane, and are anti-parallel, resulting in no net field on the free layer. The resistance of the MTJ depends on the orientation of the free layer magnetization, and modulates the source-drain current flow by a factor of ten, achievable with modern MgO MTJs.

The MTJT 602 uses a critical dimension $F_{MTJT}$=50 nm for MTJT features, though with wires and most spaces at F=100 nm, to allow fabrication with standard 193 nm optical lithography, in order to lower cost. With more aggressive (and expensive) lithography and etching, and by moving the Source contact under the Tie, the entire device could potentially occupy only $4F^2$.

The MTJT 602 operates like CMOS, with the Junction or Tie terminal acting as the gate, and the other grounded. Logic level 1 corresponds to voltages in the range $V_{th}$ to $V_{DD}$, and logic level 0 to the range $-V_{th}$ to $-V_{DD}$. $V_{th}$ is the threshold voltage such that the device switches when $|V_{Gate}|>V_{th}$. Ground is only used as a hardwired reference for the gate voltage, not as a logic level.

The MTJT 602 may operate at an input voltage of ±56 mV, enabling two orders of magnitude lower power than CMOS: $(1.1 V/2*56 mV)^2$=96, while also lowering the leakage power by an order of magnitude. The inputs and outputs of logic gates are less than $|V_{DD}|$ (since the change in $R_{SD}$ (source-drain resistance) is only a factor of 10).

A significant feature of the MTJT 602 is that this does not lead to a loss of stage-to-stage gain, because of the fundamental physical nature of magnetic anisotropy. Orthogonal uniaxial anisotropies (such as the easy-plane and voltage induced anisotropies of the writer layers) add in such a way that each writer layer is always either in-plane or out-of-plane, never in-between. This means that the MTJT 602 can have a very sharp turn-on characteristic; it is always either fully on or fully off. This means that arbitrary logic operations can be cascaded in series without loss of drive voltage. It also means there is no need to drive the inputs with the full $V_{DD}$. Instead, a typical output voltage from a previous stage of 0.7 $V_{DD}$ can be used.

A significant advantage of the MTJT 602 is that the device is non-volatile. Thus, the state of the circuit is preserved when the power is turned off. In addition, the MTJT 602 does not require a single crystal substrate, and so multiple layers of logic can be stacked in a three-dimensional fashion to achieve extremely high densities. The materials used in the MTJT 602 are also naturally radiation hard.

As discussed earlier, the MTJT 602 consists of a write part and a read part. These two parts are electrically isolated from each other, but are in close proximity, which allows the fringing magnetic fields from the write part to affect the magnetization in the read part. The write part makes use of the voltage control of anisotropy of an MgO|Fe interface. Two such interfaces are used, grown in opposite order, so that the top MgO is above the top Fe layer, but the bottom MgO is below the bottom Fe layer. This means that when a voltage is applied across the bottom Ta terminals, the two Fe layers experience opposite changes in their anisotropy. One of the layers will always be made more in-plane and the other more out-of-plane. For a sufficient voltage, roughly 100 mV, one of the Fe layers will switch from in-plane to out-of-plane. The other layer is held strongly in-plane due to the additional voltage induced in-plane anisotropy. Thick enough MgO, 2 to 3 nm, is used to make the tunneling current negligibly small. When no voltage is applied (when the power is off), the two Fe layers are in-plane and antiparallel, due to their dipole fields.

Using a thin antiferromagnet such as PtMn to weakly pin one of the layers, for example the top layer, (with a pinning field of order 100 Oe), we ensure that the top layer always points to the right, and hence the bottom layer to the left. This pinning only affects the top layer, not the bottom, and so acts as a significant source of asymmetry in this toggle-like structure. Such asymmetry means that there is only one stable state in zero field (see for example D.C. Worledge Appl. Phys. Lett. 91, 162509 (2009)), so that the write layers are stable for 10 years when the power is off. The pinning of 100 Oe from the PtMn is small compared to the easy plane anisotropy, approximately 1000 Oe, which the voltage must overcome, and so does not significantly increase the required voltage. Alternatively, the PtMn can be omitted, and the shape anisotropy of the layers is used to provide thermal stability. Electrical contact is made to the top of the stack and brought out at the side and down (shown here as the Ta post on the left), allowing for electrical contact to be made to both the bottom and top of the write layers.

It is important to emphasize that the net magnetic anisotropy of the write layers is either in the plane our out of the plane, not somewhere in-between. This means that as a function of voltage the device turns on or off abruptly, at a critical switching voltage. This means that, even if the ratio of on-state to off-state resistance is only 10 in the read layers, multiple devices can be connected in series and switched without losing gain, simply by inserting inverters or buffers (made from MTJTs) in-between every few stages of logic. The buffers or inverters ensure that the voltage is maintained at 90% of $\pm V_{DD}$, regardless of the number of stages of logic cascaded together.

The MTJ layers consist of a fairly standard tunnel junction with a simple free layer on the top and a double tunnel barrier for high MR (magnetoresistance). A single tunnel barrier can also be used. Starting from the bottom, there is a standard AP (anti-parallel) pinned layer which provides a CoFeB reference layer pointing to the left. The reference layers never switch, and their thermal stability is provided by the thick antiferromagnet, for example PtMn, below them.

The double tunnel junction uses two layers of 100 oriented MgO, separated by a thin resonant tunneling layer which contains delta1 states at the Fermi level, for example Vanadium. Other materials may be used. When the outer magnetic electrodes have anti-parallel magnetization, the resistance is high due to the effectively thick barrier composed of both MgO layers and the resonant tunneling layer. When the magnetizations are parallel, the electrons can resonantly tunnel through the Vanadium layer, giving a lower resistance. A magnetoresistance resulting in a factor of 10 change in resistance is sufficient for many applications. The thickness of the tunnel barriers are chosen to set the resistance of the patterned device to about 10 k Ohm to 10M Ohm in the low resistance state.

To fabricate the MTJT 602, the MTJ layers are deposited up to the Ta cap. Then these are etched into a pillar and a Ta (or other material) via is etched and filled to the side, at the same time contacting the top of the MTJ layers. Then the pinned layers are patterned, with the etch stopping on the top of the freelayers. Then the insulator layer is deposited, roughly 10 nm thick of low dielectric insulator (for example SiCOH) and then all of the writer layers are deposited. Then a Ta via is etched and filled. Other materials can be used than Ta for all of the via, seed, and cap layers, for example W. Other materials can be used for each of the magnetic layers—examples are given here to be specific, but are not meant to be limiting.

Designing complementary circuits analogous to CMOS requires two flavors of devices (one where applying +Vdd to the gate writes the device into the high resistance state, and the other where applying +Vdd to the gate writes the device into the low resistance state). To make the second flavor the same device is used but with the Tie terminal as the gate and set the Junction terminal to ground.

The write layers can be made the same width as the free layers. This increases the dipole field from the write layers on the free layers, and also decreases any in-plane dipole field from the perpendicular write layer on the free layers. When this wide device is used, the left write contact can be brought out at the top. This provides wiring flexibility in the circuit.

Perpendicular magnetization can also be used for all of the layers. This is useful for making devices much smaller than 40 nm in CD (critical dimension), since the perpendicular layers have more activation energy and so are more thermally stable. In this case one write layer is in each leg of the write terminals. An applied voltage makes one of the write layers rotate so that it is in-plane, thus reducing its perpendicular dipole field acting on the free layers. A thin antiferromagnet can again be used to weakly pin one of the write layers, to give the pair a unique direction in zero field. Alternatively, one of the terminals can be made larger than the other, allowing all the devices in a given circuit to be initially set into a uniform state. Alternatively, one of the layers can have a higher coercivity than the other (requiring two deposition and two etches to fabricate the write layers). An example of the perpendicular magnetic materials that can be used in the write and free layers is the L10 alloy FePt, though any other perpendicular material may be used.

A simpler stack of thick {Co|Pt} multilayers in the write layers may also be used. These materials can easily be tuned to be almost perpendicular, so that only a small voltage is needed to rotate the moments into the plane. They are then thick enough that no PtMn is needed to provide stability or to initially set the layers. A thickness imbalance in the write layers is used to set them initially. Other materials that may be used are {Co|Ni} multilayers and {Co|Pd} multilayers. With this approach the dipole field from the write layers is so large that a single layer can be used as the free layer. Further, the coercivity of the write layers is so large that the dipole field from the free layer can not disturb the write layers.

Having described embodiments for the invention (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. An apparatus for creating a magnetic field, the apparatus comprising:
   a writer including a first magnetic write layer and a second magnetic write layer;
   wherein the writer, when energized by a first write voltage, is configured to switch a magnetic anisotropy of the first magnetic write layer from parallel to a plane of the first magnetic write layer to orthogonal to the plane of the first magnetic write layer such that the second magnetic write layer induces a first magnetic field in a region proximate the writer; and
   wherein the writer, when energized by a second write voltage, is configured to switch a magnetic anisotropy of the second magnetic write layer from parallel to a plane of the second magnetic write layer to orthogonal to the plane of the second magnetic write layer such that the first magnetic write layer induces a second magnetic field in the region proximate the writer, the second magnetic field being in a direction opposite the first magnetic field.

2. The apparatus of claim 1, wherein a polarity of first write voltage is opposite to the polarity of the second write voltage.

3. The apparatus of claim 1, wherein the writer further comprises:
   a first write electrode electrically coupled to the first magnetic write layer;
   a second write electrode electrically coupled to the second magnetic write layer; and
   a dielectric write layer disposed between the first magnetic write layer and the second magnetic write layer.

4. The apparatus of claim 3, wherein:
   a first write voltage applied across the first and second write electrodes causes the magnetic anisotropy of the first magnetic write layer to be orthogonal to the plane of the first magnetic write layer; and a second write voltage applied across the first and second write electrodes opposite in polarity to the first write voltage causes the magnetic anisotropy of the second magnetic write layer to be orthogonal to the plane of the second magnetic write layer.

5. The apparatus of claim 1, wherein the first and second magnetic write layers are substantially iron (Fe).

6. The apparatus of claim 5, wherein the dielectric write layer is substantially magnesium oxide (MgO).

7. The apparatus of claim 1, wherein the region proximate to the writer includes a magnetic free layer of a magnetic tunnel junction (MTJ), a resistance of the magnetic tunnel junction is dependent on the magnetic direction of a magnetic free layer.

8. The apparatus of claim 7, further comprising a dielectric isolation layer electrically isolating the writer from the magnetic tunnel junction.

9. The apparatus of claim 8, wherein the magnetic tunnel junction comprises:
a magnetic reference layer having a magnetic direction pinned to a preset magnetic direction along the plane of the magnetic reference layer; and
a dielectric tunnel barrier configured to allow electrons to tunnel between the magnetic reference layer and the magnetic free layer.

10. The apparatus of claim 9, wherein the magnetic tunnel junction comprises:
a first MTJ electrode disposed between the dielectric isolation layer and the magnetic free layer, the first MTJ electrode being electrically coupled to the magnetic free layer; and
a second MTJ electrode electrically coupled to the magnetic reference layer.

11. A method for creating a magnetic field, the method comprising:
applying a write voltage across first and second magnetic write layers such that a magnetic anisotropy of one of the first and second magnetic write layers switches from parallel to a plane of the magnetic write layers to orthogonal to the plane of the magnetic write layers such that the magnetic write layer with the magnetic anisotropy parallel to the plane of the magnetic write layers induces the magnetic field.

12. The method of claim 11, wherein a magnetic direction of the first magnetic write layer when parallel to the plane of the magnetic write layers is opposite to a magnetic direction of the second magnetic write layer when parallel to the plane of the magnetic write layers.

13. The method of clam 11, wherein applying the write voltage across the first and second magnetic write layers comprises:

applying a first voltage potential to a first write electrode, the first write electrode being electrically coupled to the first magnetic write layer; and
applying a second voltage potential to a second write electrode, the second write electrode being electrically coupled to the second magnetic write layer.

14. The method of claim 13, wherein:
a first write voltage applied across the first and second write electrodes causes the magnetic anisotropy of the first magnetic write layer to be orthogonal to the plane of the magnetic first write layer; and
a second write voltage applied across the first and second write electrodes opposite in polarity to the first write voltage causes the magnetic anisotropy of the second magnetic write layer to be orthogonal to the plane of the second magnetic write layer.

15. The method of claim 11, wherein the first and second magnetic write layers are substantially iron (Fe).

16. The method of claim 11, further comprising:
adjusting a resistance of a magnetic tunnel junction (MTJ) disposed proximate one of the first and second magnetic write layers, wherein the resistance of the magnetic tunnel junction is dependent on the magnetic direction of a magnetic free layer receiving an induced magnetic field.

17. The method of claim 16, wherein the magnetic tunnel junction comprises:
a magnetic reference layer having a magnetic direction pinned to preset direction; and
a dielectric tunnel barrier configured to allow electrons to tunnel between the magnetic reference layer and the magnetic free layer.

18. The method of claim 17, further comprising:
applying a read current through the magnetic free layer and the magnetic reference layer.

19. A memory cell in an array of memory cells, the memory cell comprising:
a magnetic tunnel junction (MTJ) including a magnetic free layer, a resistance of the magnetic tunnel junction being dependent on a magnetic direction of the magnetic free layer; and
a writer disposed proximate the magnetic tunnel junction, the writer configured to switch a magnetic anisotropy of one of first and second magnetic write layers from parallel to a plane of the magnetic write layers to orthogonal to the plane of the magnetic write layers such that the magnetic write layer with the magnetic anisotropy parallel to the plane of the magnetic write layers induces the magnetic direction in the magnetic free layer.

20. The memory cell of claim 19, further comprising a dielectric isolation layer electrically isolating the writer from the magnetic tunnel junction.

* * * * *